United States Patent
Diankov et al.

(10) Patent No.: US 9,748,581 B2
(45) Date of Patent: Aug. 29, 2017

(54) FUNCTIONALIZED GRAPHENE-PT COMPOSITES FOR FUEL CELLS AND PHOTOELECTROCHEMICAL CELLS

(71) Applicant: The Board of Trustees of the Leland Stanford Junior University, Palo Alto, CA (US)

(72) Inventors: Georgi Diankov, Millbrae, CA (US); Jihwan An, Seoul (KR); Joonsuk Park, Stanford, CA (US); David J. K. Goldhaber, Palo Alto, CA (US); Friedrich B. Prinz, Woodside, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 203 days.

(21) Appl. No.: 14/634,791

(22) Filed: Feb. 28, 2015

(65) Prior Publication Data
US 2015/0247258 A1 Sep. 3, 2015

Related U.S. Application Data

(60) Provisional application No. 61/946,377, filed on Feb. 28, 2014.

(51) Int. Cl.
| | |
|---|---|
| *C30B 1/10* | (2006.01) |
| *H01M 4/92* | (2006.01) |
| *H01M 4/88* | (2006.01) |
| *C23C 16/02* | (2006.01) |
| *C23C 16/40* | (2006.01) |
| *C23C 16/455* | (2006.01) |

(52) U.S. Cl.
CPC ........ *H01M 4/925* (2013.01); *C23C 16/0272* (2013.01); *C23C 16/40* (2013.01); *C23C 16/45555* (2013.01); *H01M 4/8817* (2013.01); *H01M 4/8867* (2013.01); *H01M 4/926* (2013.01)

(58) Field of Classification Search
CPC .............. C30B 1/10; C30B 1/02; C30B 23/02
See application file for complete search history.

(56) References Cited

U.S. PATENT DOCUMENTS

| | | | |
|---|---|---|---|
| 8,158,200 B2 | 4/2012 | Kelber | |
| 2014/0219906 A1 | 8/2014 | Kim et al. | |

OTHER PUBLICATIONS

Diankov et al. Extreme Monolayer—Selectivity of Hydrogen—Plasma Reactions with Graphene. American Chemical Society, 2013 vol. 7, No. 2 pp. 1324-1332.

*Primary Examiner* — Robert M Kunemund
(74) *Attorney, Agent, or Firm* — Lumen Patent Firm

(57) ABSTRACT

A method of growing crystals on two-dimensional layered material is provided that includes reversibly hydrogenating a two-dimensional layered material, using a controlled radio-frequency hydrogen plasma, depositing Pt atoms on the reversibly hydrogenated two-dimensional layered material, using Atomic Layer Deposition (ALD), where the reversibly hydrogenated two-dimensional layered material promotes loss of methyl groups in an ALD Pt precursor, and forming Pt-O on the reversibly hydrogenated two-dimensional layered material, using combustion by $O_2$, where the Pt-O is used for subsequent Pt half-cycles of the ALD process, where growth of Pt crystals occurs.

10 Claims, 6 Drawing Sheets

FUNCTIONALIZED GRAPHENE-PT COMPOSITES FOR FUEL CELLS AND PHOTOELECTROCHEMICAL CELLS

CROSS-REFERENCE TO RELATED APPLICATIONS

This application claims priority from U.S. Provisional Patent Application 61/946,377 filed Feb. 28,2014, which is incorporated herein by reference.

STATEMENT OF GOVERNMENT SPONSORED SUPPORT

This invention was made with Government support under contract no. DE-SC0001060 awarded by the Department of Energy. The Government has certain rights in the invention.

FIELD OF THE INVENTION

The present invention relates generally to electrodes for high-performance energy conversion and storage devices. More particularly, the invention relates to a method of controlled radio-frequency hydrogen plasma to treat graphene and other two-dimensional layered materials, such as hexagonal boron nitride (hBN) and dichalcogenides such as molybdenum sulfide ($MoS_2$) for growing crystallographically oriented nanocrytals with catalytic properties and dielectric thin films using Atomic Layer Deposition, while retaining the graphene's intrinsic properties.

BACKGROUND OF THE INVENTION

Existing challenges in electrochemical energy conversion technology electrochemical energy-conversion devices, such as fuel cells and photoelectrochemical cells, face two main obstacles: significant overpotentials arising from surface kinetics and mass transport, especially at the Oxygen Reduction Reaction (ORR) in fuel cells and the Oxygen Evolution Reaction (OER) in water-splitting cells; and high catalyst mass loading that drives up costs and impedes the widespread adoption of these devices.

State-of-the-art commercial Pt/C cathodes for Proton Exchange Membrane (PEM) fuel cells exhibit specific Pt loading of 0.5 g/kW, arising from loading-per-functioning area of 0.5 $g/cm^2$. While such fuel cells exhibit a high power density of 1$W/cm^2$, they suffer from quick catalyst degradation, sluggish ORR with large overpotentials, and unsustainably large catalyst mass loading.

Graphene-like materials have been widely researched for electrochemical energy conversion devices, with claimed performances better than commercial Pt/Vulcan materials on some metrics.

In such a fast-moving field it is difficult to assess which routes are most promising, but it is seen that almost all existing schemes cannot maintain the most attractive features of graphene, such as high conductivity and carrier mobility. The main graphene-derived material studied so far has been Graphene Oxide (GO), a bulk material prepared through a sequence of harsh oxidation and reduction wet chemistry reactions. GO is economical but suffers from high resistivity due to numerous oxygen-containing defects. Moreover, the wet chemistry involved is often incompatible with further processing and large scale production necessary for eventual technological applications. At the same time, it is exactly these functional groups that provide GO with the ability to bond to catalyst nanoparticles and even facilitate oxygen anion transport, which pristine graphene cannot do on its inert basal planes.

Clearly, the ideal graphene material would overcome this trade-off. Such a material would have the necessary chemical functionalization but would retain pristine graphene's unique electronic and thermal transport properties.

What is needed is a material system that provides nano-sized catalysts directly grown on chemically-activated graphene in a process that is cost-effective and entirely compatible with large-scale industrial production, in addition to preserving much of pristine graphene's outstanding properties, while activating the graphene toward catalyst-growth chemistry.

SUMMARY OF THE INVENTION

To address the needs in the art, a method of growing crystals on two-dimensional layered material is provided that includes reversibly hydrogenating a two-dimensional layered material, using a controlled radio-frequency hydrogen plasma, depositing Pt atoms on the reversibly hydrogenated two-dimensional layered material, using Atomic Layer Deposition (ALD), where the reversibly hydrogenated two-dimensional layered material promotes loss of methyl groups in an ALD Pt precursor, and forming Pt-O on the reversibly hydrogenated two-dimensional layered material, using combustion by $O_2$, where the Pt-O is used for subsequent Pt half-cycles of the ALD process, where growth of Pt crystals occurs.

According to one aspect of the invention, the two-dimensional layered material can include graphene, hexagonal boron nitride, or dichalcogenides. In one aspect, the dichalcogenides can include molybdenum sulfide ($MoS_2$), or tungsten selenide ($WSe_2$).

In another aspect of the invention, the reversibly hydrogenated two-dimensional layered material is dehydrogenated prior to depositing the Pt using the ALD. In one aspect the dehydrogenating is done by annealing two-dimensional layered material under argon at 300° C.

To further address the needs in the art, according to one embodiment, a method of growing crystals on a two-dimensional layered material is provided that includes reversibly hydrogenating a two-dimensional layered material, using a controlled radio-frequency hydrogen plasma, depositing crystal-forming molecules on the reversibly hydrogenated two-dimensional layered material, using atomic layer deposition (ALD), where the reversibly hydrogenated two-dimensional layered material promotes loss of methyl groups in an ALD precursor, and forming crystal-$O_x$ on the reversibly hydrogenated two-dimensional layered material, using combustion by $O_2$, where the crystal-$O_x$ is used for a subsequent half-cycle of the ALD process, where growth of the crystals occurs.

According to one aspect of the current embodiment, the two-dimensional layered material can include graphene, hexagonal boron nitride, or dichalcogenides. In one aspect the dichalcogenides can include molybdenum sulfide ($MoS_2$), tungsten selenide ($WSe_2$) or others.

According to another aspect of the current embodiment, the crystal-forming molecule includes Ti, where $TiO_2$ crystals are formed on the reversibly hydrogenated two-dimensional layered material.

In a further aspect of the current embodiment, the crystal-forming molecule includes $Al_2$, where $Al_2O_3$ crystals are formed on the reversibly hydrogenated two-dimensional layered material.

In yet another aspect of the current embodiment, the reversibly hydrogenated two-dimensional layered material is dehydrogenated prior to depositing the crystal-forming molecule using the ALD. In one aspect, the dehydrogenating is done by annealing two-dimensional layered material under argon at 300° C.

BRIEF DESCRIPTION OF THE DRAWINGS

(FIG. 1A.) atomic force microscopy image of 1L graphene on $SiO_2$ substrate, and (FIG. 1B) Raman spectra of hydrogenated and hygrogenated+dehydrogenated 1L grapheme; (FIG. 1C) AFM topography of monolayer graphene treated with remote hydrogen plasma in the same chamber to create numerous hole (Left: holes with diameters of 450 nm), (Right: holes with diameters of 20 nm and less), according to one embodiment of the invention.

(FIG. 3A), (FIG. 3B) atomic force microscopy images of 1-layer (1L) graphene. (FIG. 3C) Raman spectra of hydrogenated 1L grapheme before and after ALD, which shows suppressed D-band after ALD, according to one embodiment of the current invention.

DETAILED DESCRIPTION

Figure 1A:
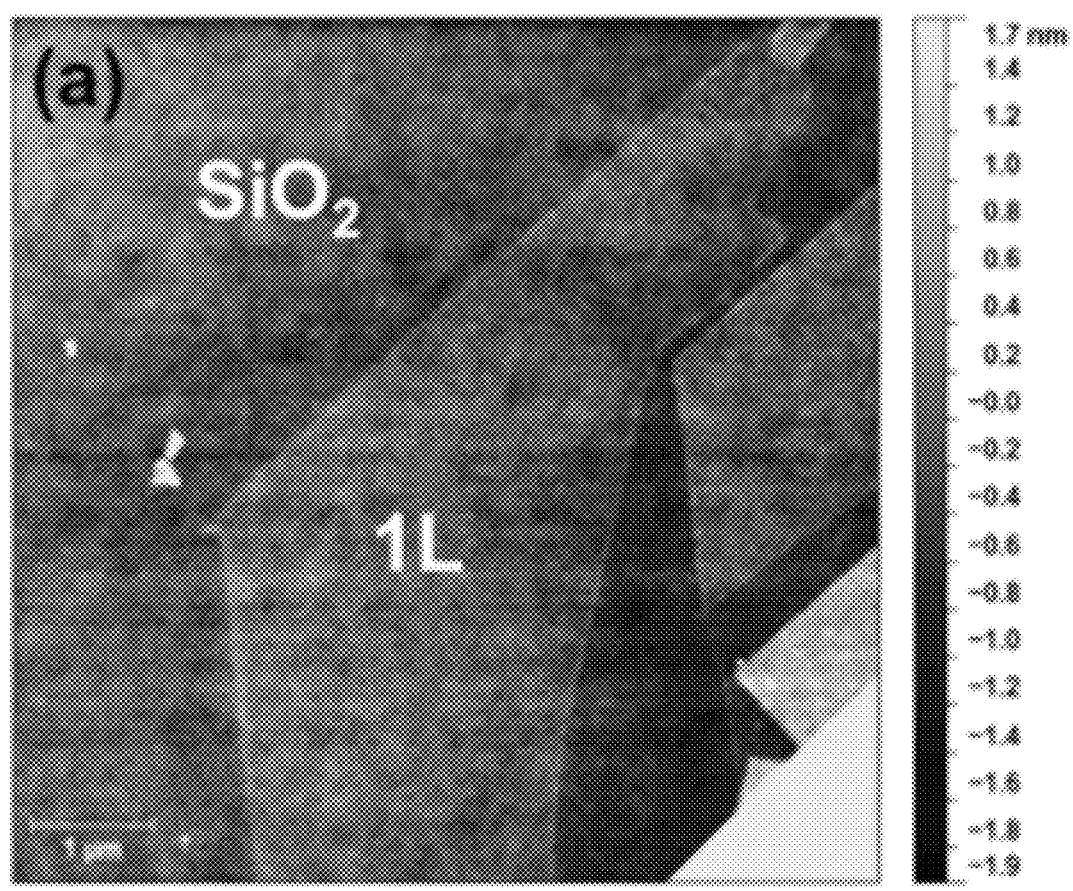
FIGS. 1A-1C show reversible hydrogenation of graphene without damage.

The current invention uses controlled radio-frequency hydrogen plasma to treat graphene and then epitaxially grow various nanocrystals and dielectric thin films using Atomic Layer Deposition, while retaining the graphene's intrinsic properties.

The current invention is used in energy conversion and storage devices, such as fuel cells, solar cells, and photo-electrochemical water-splitting cells; for electronic devices that require the use of dielectric spacers and top gates; and for thermal transport devices. Further, the invention provides the ability to build hierarchical chemical structures on top of a graphene substrate for biological sensing and diagnostics, and chemical sensing.

This invention may solve crucial commercial problems in the near future, as graphene materials enter the industrial realm in areas such as fuel cells, electronics and sensors.

Existing methods of using graphene for the above-mentioned purposes generally require wet chemistry, such as harsh oxidation of graphene, which results in the loss of graphene's intrinsic properties. One embodiment of the current invention circumvents this problem and retains most of graphene's outstanding properties, such as electrical conductivity.

Moreover, the current invention does not require the use of solvents, oxidizers and high temperatures and is compatible with existing industrial processes in the semiconductor, photovoltaic and electrochemical industries. Finally, in one embodiment, the invention is able to control the growth parameters of the nanocrystals, such as size and density, by suitable treatment of the graphene surface. This invention is fully compatible with exfoliated graphene, Chemical Vapor Deposition (CVD) graphene, and chemically-derived bulk graphene materials. The methods used for epitaxial growth of nanocrystals on graphene are shown to be applicable to other layered materials of industrial importance, such as hBN and $MoS_2$.

Other embodiments of the invention include tuning the hydrogen plasma treatment conditions: power, plasma species temperature and density, substrate pre-treatment, substrate orientation, and also by varying the Atomic Layer Deposition methods, such as temperature, pressure, precursor type and number of cycles. The invention provides control of key features of the growth process, such as size, density, crystallographic orientation and thickness.

A key embodiment of the invention is the achievement of epitaxial growth of nanocrystals on graphene and other two-dimensional materials, as directly observed by Scanning Transmission Electron Microscopy. The epitaxial interfaces will provide an added benefit to the stability and efficiency of nanosized catalysts and nanoparticles used to modulate thermal transport.

Another embodiment is the crystallographic orientation and faceting of the nanosized catalysts grown on these substrates that is expected to result in highly enhanced catalytic activity.

The current invention provides controllable hydrogenation of graphene basal planes without apparent sputtering of carbon atoms by energetic plasma species. The invention uses the different chemical reactivities of graphene sheets of different thicknesses to achieve tunable areal coverage, size and orientation of the grown nanosized catalysts.

Figure 1B:
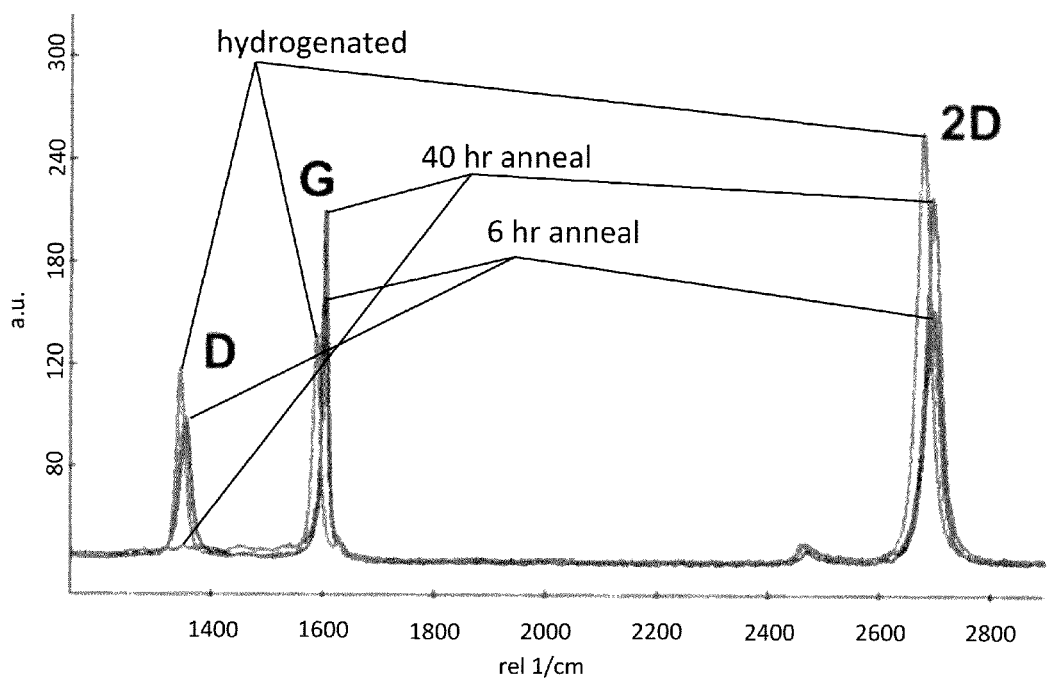
Figure 1C:
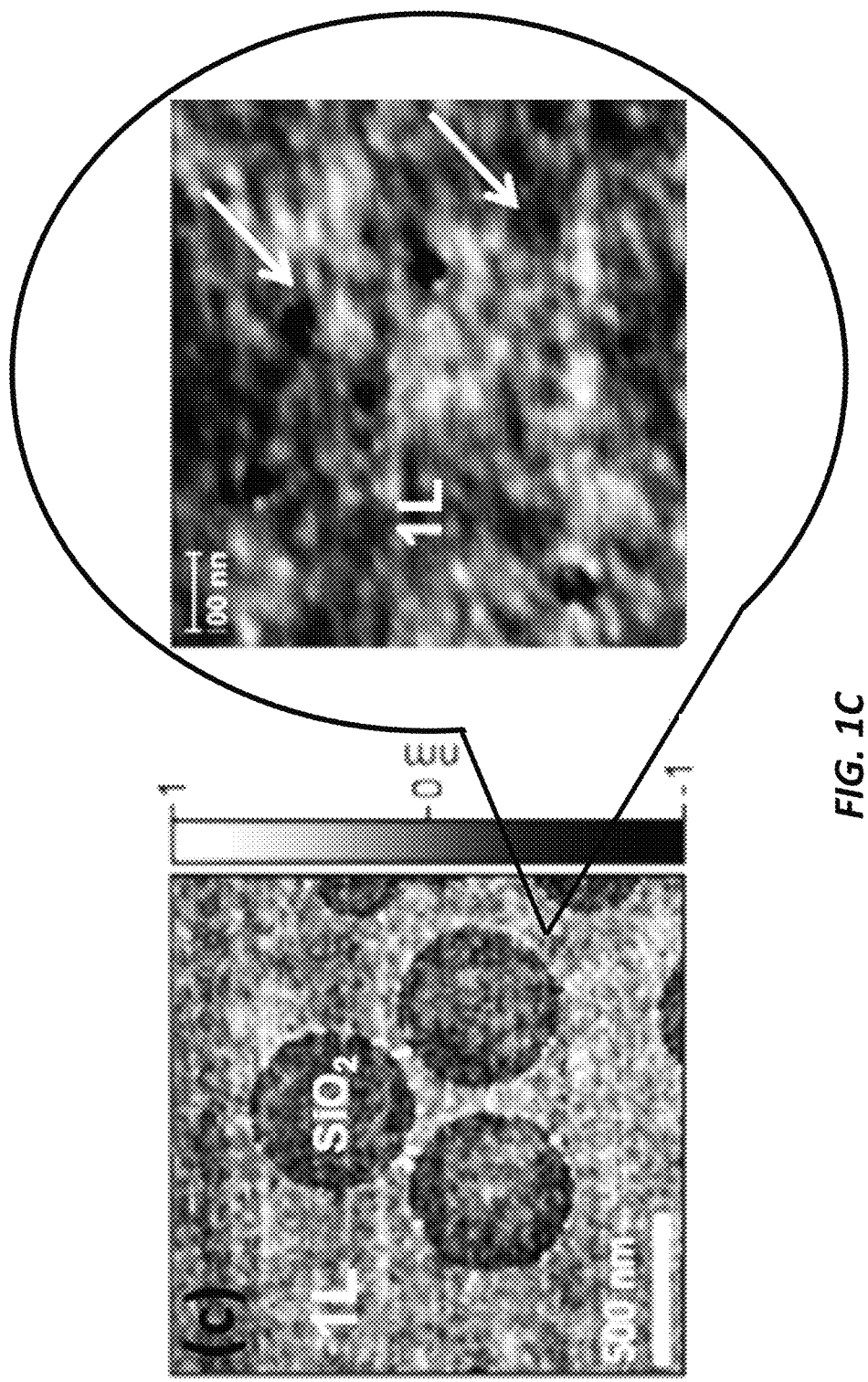
Figure 2A:
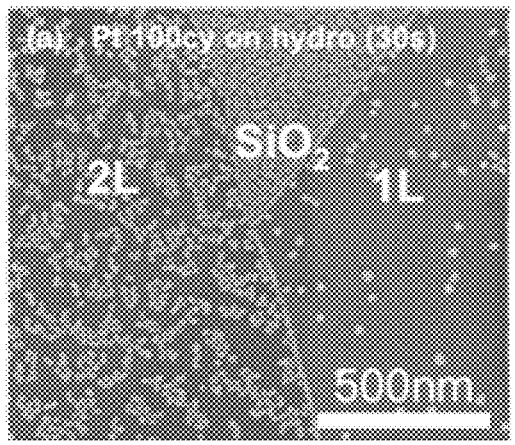
FIGS. 2A-2D show scanning electron microscopy (SEM) images illustrating the dependence of the density of Pt nanoparticles on layer thickness, hydrogenation time, and dehydrogenation. As shown, ALD Pt 100 cycles on (FIG. 2A) hydrogenated (30s), (FIG. 2B) hydrogenated (30s)+dehydrogenated, (FIG. 2C) hydrogenated (120s), and (FIG. 2D) hydrogenated (120s) dehydrogenated graphenes. Here, 1L represents a monolayer, 2L represents a bilayer, and Multi L represents multi-layer grapheme, according to one embodiment of the current invention.
Figure 2B:
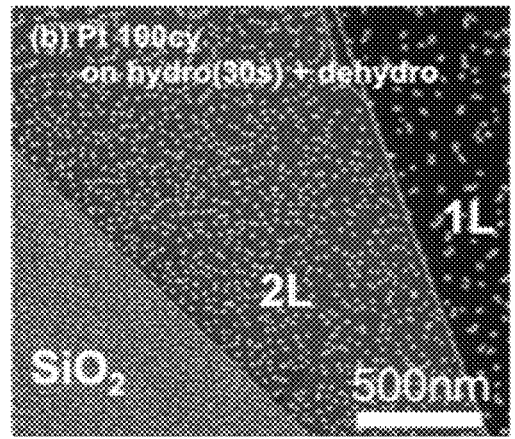
Figure 2C:
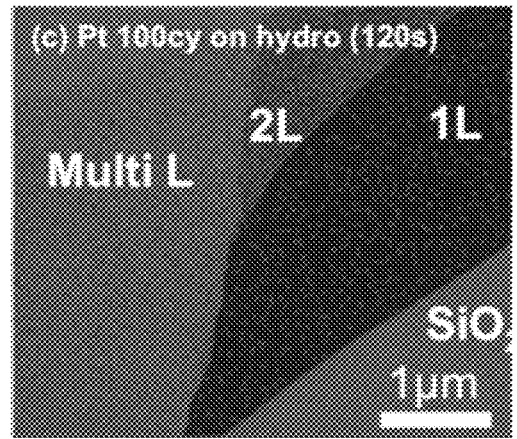
Figure 2D:
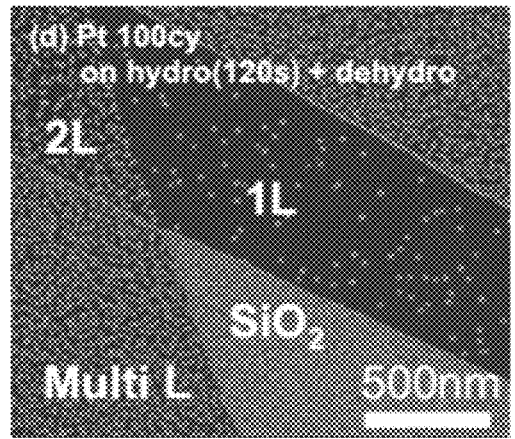

According to one embodiment, the hydrogenation is reversible upon annealing under argon at 300° C. Raman spectroscopy, an inelastic light scattering technique widely used in graphene characterization, reveals that the so-called Raman "defect band" (D-band), is prominent after hydrogenation due to the formation of sp3 C—H bonds, but is almost entirely suppressed after dehydrogenation, as shown in FIGS. 1A-1C.

According to the current invention, this is the first time that dehydrogenated grapheme is near pristine electrically and structurally, and is strikingly chemically reactive, as evidenced in the ability to grow high areal densities of Pt nanoparticles by Atomic Layer Deposition (ALD) on graphene basal planes. Graphene basal surfaces were previously inert toward ALD growth, and until now, it was demonstrated that platinum ALD on graphitic surfaces (HOPG) exclusively produces particles on step edges, where on pristine graphene, nanoparticles exclusively grew on the edges of sheets and step edges of multilayer grapheme sheets, according to the current invention.

The process of the current invention results in the unusual combination of enhanced chemical reactivity and near-pristine electrical properties. Based on initial work, it is believed that this material possesses properties not found in existing graphene composites: the graphene surfaces retain their conductivity, and their functionalization can be used as a control knob that directly influences the density and shape of catalyst nanoparticles.

While the exemplary embodiment includes using high-quality exfoliated graphene as a model system, other embodiments for electrode fabrication can include use of large-area CVD graphene and high-quality graphene laminates that approximate the intrinsic properties of pristine exfoliated graphene, while offering a bridge toward manufacturability. Further embodiments include the use of other two-dimensional materials such as hexagonal Boron Nitride and molybdenum disulfide, layered materials of great industrial importance.

The current invention provides a material system can overcome key challenges in fuel cell performance by allowing:

1) nanodispersion of catalysts, and mass loading reduced by up to a factor of 10;

2) reduction in device component sizes, leading to further cost savings; and 3) mechanically robust, electrically conducting graphene supports that also offer chemical anchor sites for nanosized catalysts.

State-of-the-art commercial Pt/C cathodes for Proton Exchange Membrane (PEM) fuel cells exhibit specific Pt loading of 0.5 g/kW, arising from loading-per-functioning area of 0.5 g/cm$^2$. While such fuel cells exhibit a high power density of 1 W/cm$^2$, they suffer from quick catalyst degradation, sluggish ORR with large overpotentials, and unsustainably large catalyst mass loading.

The current invention provides a method of cathode engineering that is capable of platinum mass activity of 0.1 g/kW or below, while maintaining high power density of ~1 W/cm$^2$, This method is further applied to cathode engineering in photoelectrochemical cells for watersplitting.

The resulting engineered graphene material according to one embodiment of the current invention possesses near-pristine properties and high chemical reactivity for nano-sized catalyst growth and attachment. This combination makes the material an excellent candidate for electrochemical device electrode assembly.

In one embodiment, the invention uses process parameters to tune the surface properties and directly influence nanoparticle properties, such as density and size. The invention reveals a dependence of particle density and size on graphene layer thickness and degree of hydrogenation, as shown in FIGS. 2A-2D. Here, nanoparticle growth proceeds through a hydroxide-containing functional group tethered to the activated graphene, Where the Pt nanoparticles chemically bond to the graphene support. The molecular linker between the graphene plane and the platinum nanoparticles by are investigated by tip-enhanced Raman spectroscopy with a 10-n. resolution, The ability to allow passage of ions through the support is crucial in fuel cell applications, but pristine graphene membranes block almost all atoms and ions. The current invention uses a RF hydrogen plasma treatment that results in a range of hole sizes, including sub-10 nm pores in the graphene sheets.

Crucially, the pore formation retains the graphene sheets' physical integrity and the conductive path for carriers to be collected. The pores allow ion passage, while the graphene sheet collects carriers and serves as stable anchoring support for catalyst growth. Early calculations indicate that negatively charged oxide-ions can penetrate through the carbon rings of graphene and incorporate into positively charged vacancies at the electrolyte surface with a negligible activation energy barrier.

FIGS. 2A-2D show scanning electron microscopy (SEM) images illustrating the dependence of the density of Pt nanoparticles on layer thickness, hydrogenation time, and dehydrogenation. As shown, ALD Pt 100 cycles on (see FIG. 2A) hydrogenated (30 s), (see FIG. 29) hydrogenated (30 s)+dehydrogenated, (see FIG. 2C) hydrogenated (120 s), and (see FIG. 2D) hydrogenated (120 s)+dehydrogenated graphenes. Here, 1L represents a monolayer, 2L represents a bilayer, and Multi L represents multi-layer grapheme, according to one embodiment of the current invention.

Figures 3A, 3B:
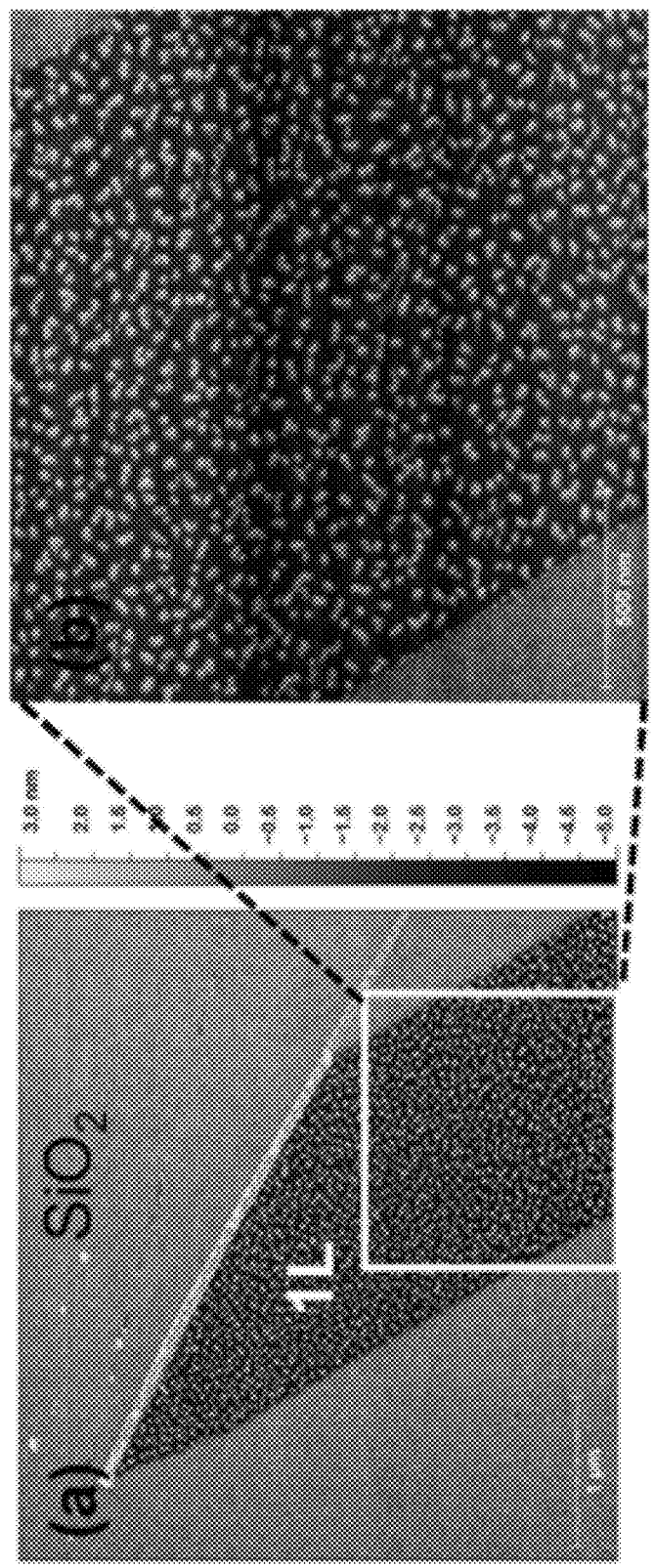
FIGS. 3A-3C show ALD Pt nanoparticle growth on chemically activated, i.e., hydrogenated, graphene support.
Figure 3C:
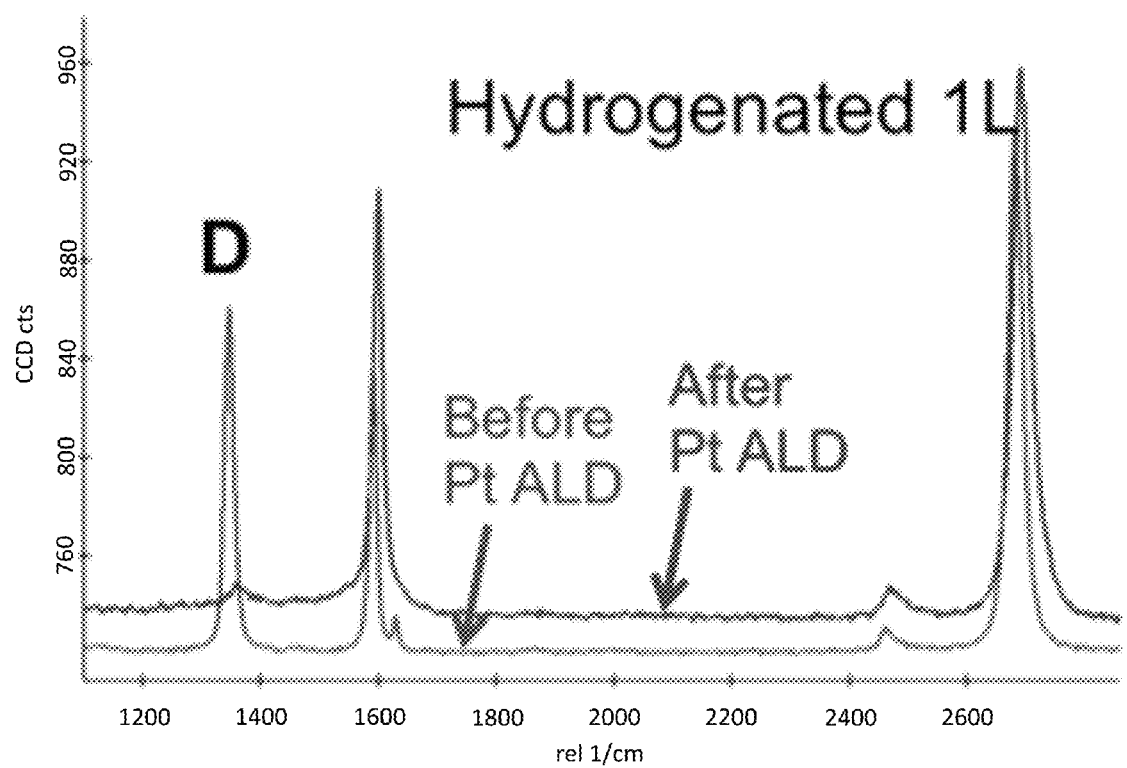

FIGS. 3A-3C show ALD Pt nanoparticle growth on chemically activated, i.e., hydrogenated, graphene support: (see FIG. 3A), (see FIG. 3B) atomic force microscopy images of 1-layer (1L) graphene. (see FIG. 3C) Raman spectra of hydrogenated 1L grapheme before and after ALD, which shows suppressed D-band after ALD, according to one embodiment of the current invention.

The current invention benefits two classes of electrochemical devices: fuel cells and photoelectrochemical cells (PEC). Regarding fuel cells, one of the main challenges in fuel cells, especially those working at low temperatures, such as polymer electrolyte membrane fuel cells (PEMFC) and low-temperature solid-oxide fuel cells (SOFC), is the sluggish Oxygen Reduction Reaction (ORR) at the cathode. To compensate for the slow reaction kinetics of the ORR, a major effort is underway to increase the density of the so-called triple phase boundary (TPB), where the electrode, electrolyte and oxygen form an interface and where the reaction occurs. At the same time, Pt is the most efficient and most costly catalyst for ORR. Therefore, an efficient cathode structure formed by the current invention fulfills the following requirements: 1) large TPB density for fast electrochemical reaction rate; 2) large electrical conductivity for electron transport; 3) low Pt material loading and 4) good chemical/mechanical stability to be economically viable and stable for long-term operation. While a complete electrode made of Pt only is attainable by forming a continuous film structure, there is an inherent trade-off in such a structure between TPB density and electrical conductivity: increasing TPB, through formation of discrete particles, can only come at the expense of electrical conductivity. The current invention satisfies all these requirements with the graphene-Pt composites.

First, the TPB density on the graphene of the current invention can be as high as 0.4 nm/nm$^2$, which is 8 times larger than that of a sputtered Pt electrode (0.05 nm/nm$^2$, Pt-only electrode) for a low-temperature SOFC. Also, the electrochemical active surface areas (ECSA) of this graphene-Pt composite is higher than that of commercial Pt/C electrodes (26-55 m$^2$/g for PEMFC) and higher than published ECSA of graphene oxide-Pt composites, given the fact that very high areal densities of Pt nanoparticles on graphene basal planes are achieved (more than 50% for single-layer graphene and more than 80% for multilayer graphene, figures that are remarkably high compared to that of commercial Pt-C electrodes). Second, the electrical sheet resistance can be still maintained at <300 Ω/, which is significantly lower than that of graphene oxide (>10 kΩ/), where (Ω/) is Ω/sq. Moreover, significant benefits from the reduced Pt mass loading are provided, which remains a challenge to fuel cell adoption due to the prohibitive cost of the Pt catalyst (~$50 /g). In a previous study, it was demonstrated that the Pt mass loading decreases by 8 times (0.16→0.02 mg/cm2, active cathode area) without sacrificing performance, by using ALD on low-temperature SOFCs. Pt mass loading can be further decreased down to less than 0.005 mg/cm2 with the use of our graphene-Pt composites with ALD Pt cycles of less than 50 cycles. This is also significantly lower than the Pt loading of commercial 100 kW-PEMFC for small-to-medium size vehicles (50 g/100 kW, ~0.25 mg/cm$^2$ (active cathode area). By combining these advantages, PEMFC and low temperature SOFC are fabricated with extremely low Pt loading of 0.005 mg/cm$^2$, which means that the Pt loading of 100 kW-fuel cell could be as low as 1 g, compared with the current 50 g. Such a reduction, coupled with maintaining comparable energy densities as those of conventional automotive fuel cells today, leads to substantial cost savings.

In addition to fuel cells, an application for our graphene-Pt composite material in solar photoelectrochemical (PEC) hydrogen production exists. $TiO_2$ is considered one of the best photocatalytic materials due to its thermodynamic stability, strong oxidizing power, and relative non-toxicity. Under the UV irradiation, photo-induced electron-hole pairs are generated and the electrons then drive the watersplitting reaction to produce hydrogen. In water-splitting, the challenges include: 1) reducing the rapid recombination rate of electrons and holes in $TiO_2$, and 2) reducing the large overpotential for the oxygen evolution reaction (OER). The current invention allows for fabricating dense $TiO_2$ nanoparticles via ALD on the functionalized graphene to address these issues.

First, the supporting graphene is an efficient electron transfer channel, which reduces the recombination of the photogenerated electron holes, and eventually leads to enhanced photoconversion efficiency compared to the graphene-oxide. The current invention provides for achieving a recombination rate comparable to that achieved on widely used transparent conducting oxide (TCO) substrates. Second, the overpotential for OER at the photoanode interface is reduced by the large density of $TiO_2$ nanoparticles on the chemically activated graphene. Commercial $Pt-TiO_2$ with surface area of 320 $m^2/g$ shows an $H_2$ production rate of 20 µmol/h. According to the invention, the $H_2$ production rate >100µmol/h (1 g catalyst, in 40 mmol NaI) with ALD $TiO_2$ nanoparticles on the functionalized graphene supports.

Furthermore, as with Pt ALD on graphene, an enhanced mechanical and chemical stability of $TiO_2$ nanoparticles is provided due to chemical bonding to the graphene support.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A method of growing crystals on two-dimensional layered material, comprising:
   a. reversibly hydrogenating a two-dimensional layered material, using a controlled radio-frequency hydrogen plasma;
   b. depositing Pt atoms on said reversibly hydrogenated or on a dehydrogenated two-dimensional layered material, using Atomic Layer Deposition (ALD), wherein said reversibly hydrogenated two-dimensional layered material promotes loss of methyl groups in an ALD Pt precursor, wherein said reversibly hydrogenated two-dimensional layered material is dehydrogenated prior to depositing said Pt using said ALD; and
   c. forming Pt-O on said reversibly hydrogenated two-dimensional layered material, using combustion by $O_2$, wherein said Pt-O is used for subsequent Pt half-cycles of said ALD process, wherein growth of Pt crystals occurs.

2. The method according to claim 1, wherein said two-dimensional layered material is selected from the group consisting of graphene, hexagonal boron nitride, and metal dichalcogenides.

3. The method according to claim 2, wherein said metal dichalcogenides are selected from the group consisting of molybdenum sulfide ($MoS_2$), and tungsten selenide ($WSe_2$).

4. The method according to claim 1, wherein said dehydrogenating is done by annealing two-dimensional layered material under argon at 300° C.

5. A method of growing crystals on a two-dimensional layered material, comprising:
   a. reversibly hydrogenating a two-dimensional layered material, using a controlled radio-frequency hydrogen plasma;
   b. depositing crystal-forming molecules on said reversibly hydrogenated or on a dehydrogenated two-dimensional layered material, using atomic layer deposition (ALD), wherein said reversibly hydrogenated two-dimensional layered material promotes loss of methyl groups in an ALD precursor, wherein said reversibly hydrogenated two-dimensional layered material is dehydrogenated prior to depositing said Pt using said ALD; and
   c. forming crystal-$O_x$ bonds on said reversibly hydrogenated two-dimensional layered material, using combustion by $O_2$, wherein said crystal-$O_x$ is used for a subsequent half-cycle of said ALD process, wherein growth of said crystals occurs.

6. The method according to claim 5, wherein said two-dimensional layered material is selected from the group consisting of graphene, hexagonal boron nitride, and dichalcogenides.

7. The method according to claim 6, wherein said dichalcogenides are selected from the group consisting of molybdenum sulfide ($MoS_2$), and tungsten selenide ($WSe_2$).

8. The method according to claim 5, wherein said crystal-forming molecule comprises Ti, wherein $TiO_2$ crystals are formed on said reversibly hydrogenated two-dimensional layered material.

9. The method according to claim 5, wherein said crystal-forming molecule comprises $Al_2$, wherein $Al_2O_3$ crystals are formed on said reversibly hydrogenated two-dimensional layered material.

10. The method according to claim 5, wherein said dehydrogenating is done by annealing two-dimensional layered material under argon at 300° C.

* * * * *